(12) United States Patent
Pattanayak et al.

(10) Patent No.: US 9,425,043 B2
(45) Date of Patent: Aug. 23, 2016

(54) HIGH MOBILITY POWER METAL-OXIDE SEMICONDUCTOR FIELD-EFFECT TRANSISTORS

(75) Inventors: Deva Pattanayak, Saratoga, CA (US); Kuo-In Chen, Los Altos, CA (US); The-Tu Chau, San Jose, CA (US)

(73) Assignee: Vishay-Siliconix, Santa Clara, CA (US)

( * ) Notice: Subject to any disclaimer, the term of this patent is extended or adjusted under 35 U.S.C. 154(b) by 0 days.

(21) Appl. No.: 11/644,553

(22) Filed: Dec. 22, 2006

(65) Prior Publication Data

US 2007/0262360 A1 Nov. 15, 2007

Related U.S. Application Data

(60) Provisional application No. 60/753,550, filed on Dec. 22, 2005.

(51) Int. Cl.
| | | |
|---|---|---|
| H01L 29/04 | (2006.01) | |
| H01L 21/02 | (2006.01) | |
| H01L 29/739 | (2006.01) | |
| H01L 29/06 | (2006.01) | |
| H01L 29/423 | (2006.01) | |
| H01L 29/78 | (2006.01) | |

(52) U.S. Cl.
CPC .... *H01L 21/02433* (2013.01); *H01L 21/02516* (2013.01); *H01L 21/02609* (2013.01); *H01L 29/04* (2013.01); *H01L 29/045* (2013.01); *H01L 29/0696* (2013.01); *H01L 29/4236* (2013.01); *H01L 29/7395* (2013.01); *H01L 29/7397* (2013.01); *H01L 29/7802* (2013.01); *H01L 29/7813* (2013.01); *H01L 29/4238* (2013.01)

(58) Field of Classification Search
CPC ............ H01L 29/7827; H01L 29/7813; H01L 29/66734; H01L 29/4236; H01L 29/7395
USPC ......... 257/255, 262, 263, 328, 329, 330, 331, 257/332, E29.189, E29.003, E29.004
See application file for complete search history.

(56) References Cited

U.S. PATENT DOCUMENTS 4,131,524 A * 12/1978 Gieles ........................... 438/478
4,478,655 A   10/1984 Nagakubo et al.
(Continued)

FOREIGN PATENT DOCUMENTS

EP     0238749     10/1986
EP     0354449     2/1990
(Continued)

OTHER PUBLICATIONS

Application as Filed; U.S. Appl. No. 12/123,664; Deva Pattanayak; et al., Filed on May 20, 2008.
(Continued)

*Primary Examiner* — Eduardo A Rodela

(57) ABSTRACT

High mobility P-channel power metal oxide semiconductor field effect transistors. In accordance with an embodiment of the present invention, a power MOSFET is fabricated such that the holes flow in an inversion/accumulation channel, which is along the (110) crystalline plane, or equivalents, and the current flow is in the [110] direction, or equivalents, when a negative potential is applied to the gate with respect to the source. The enhanced channel mobility of holes leads to a reduction of the channel portion of the on-state resistance, thereby advantageously reducing total "on" resistance of the device.

5 Claims, 9 Drawing Sheets

(56) References Cited

U.S. PATENT DOCUMENTS

| | | | |
|---|---|---|---|
| 4,605,919 A * | 8/1986 | Wilner | 338/2 |
| 4,660,068 A | 4/1987 | Sakuma et al. | |
| 4,758,531 A | 7/1988 | Beyer et al. | |
| 4,799,990 A | 1/1989 | Kerbaugh et al. | |
| 4,835,585 A | 5/1989 | Panousis | |
| 4,843,025 A | 6/1989 | Morita | |
| 4,857,986 A | 8/1989 | Kinugawa | |
| 4,939,557 A | 7/1990 | Pao et al. | |
| 5,087,586 A | 2/1992 | Chan et al. | |
| 5,182,233 A * | 1/1993 | Inoue | 83/35 |
| 5,366,914 A * | 11/1994 | Takahashi et al. | 438/270 |
| 5,602,424 A | 2/1997 | Tsubouchi et al. | |
| 5,814,858 A | 9/1998 | Williams | |
| 5,963,822 A | 10/1999 | Saihara et al. | |
| 5,965,904 A * | 10/1999 | Ohtani et al. | 257/57 |
| 6,059,981 A * | 5/2000 | Nakasuji | 216/2 |
| 6,153,896 A | 11/2000 | Omura et al. | |
| 6,180,966 B1 * | 1/2001 | Kohno et al. | 257/173 |
| 6,245,615 B1 | 6/2001 | Noble et al. | |
| 6,359,308 B1 | 3/2002 | Hijzen et al. | |
| 6,373,100 B1 | 4/2002 | Pages et al. | |
| 6,436,791 B1 | 8/2002 | Lin et al. | |
| 6,483,171 B1 | 11/2002 | Forbes et al. | |
| 6,495,883 B2 | 12/2002 | Shibata et al. | |
| 6,580,154 B2 | 6/2003 | Noble et al. | |
| 6,605,843 B1 | 8/2003 | Krivokapic et al. | |
| 6,621,132 B2 | 9/2003 | Onishi et al. | |
| 6,630,389 B2 | 10/2003 | Shibata et al. | |
| 6,710,403 B2 | 3/2004 | Sapp | |
| 6,903,393 B2 * | 6/2005 | Ohmi et al. | 257/288 |
| 6,919,610 B2 | 7/2005 | Saitoh et al. | |
| 6,924,198 B2 | 8/2005 | Williams et al. | |
| 6,960,821 B2 | 11/2005 | Noble et al. | |
| 6,967,112 B2 | 11/2005 | Maa et al. | |
| 6,995,439 B1 | 2/2006 | Hill et al. | |
| 7,217,606 B2 * | 5/2007 | Forbes et al. | 438/197 |
| 7,348,244 B2 | 3/2008 | Aoki et al. | |
| 7,361,952 B2 * | 4/2008 | Miura et al. | 257/330 |
| 7,663,195 B2 | 2/2010 | Ohmi et al. | |
| 7,928,518 B2 | 4/2011 | Ohmi et al. | |
| 8,409,954 B2 | 4/2013 | Chau et al. | |
| 2001/0026006 A1 | 10/2001 | Noble et al. | |
| 2002/0104988 A1 | 8/2002 | Shibata et al. | |
| 2002/0155685 A1 | 10/2002 | Sakakibara | |
| 2003/0008483 A1 * | 1/2003 | Sato et al. | 438/514 |
| 2003/0073271 A1 | 4/2003 | Birner et al. | |
| 2003/0082873 A1 | 5/2003 | Zambrano | |
| 2003/0102564 A1 | 6/2003 | Darwish | |
| 2004/0155287 A1 | 8/2004 | Omura et al. | |
| 2004/0161886 A1 * | 8/2004 | Forbes et al. | 438/198 |
| 2004/0185665 A1 * | 9/2004 | Kishimoto et al. | 438/689 |
| 2004/0198003 A1 | 10/2004 | Yeo et al. | |
| 2005/0026369 A1 | 2/2005 | Noble et al. | |
| 2005/0029585 A1 | 2/2005 | He et al. | |
| 2005/0079678 A1 | 4/2005 | Verma et al. | |
| 2005/0224890 A1 * | 10/2005 | Bernstein et al. | 257/371 |
| 2005/0250276 A1 | 11/2005 | Heath et al. | |
| 2005/0253193 A1 | 11/2005 | Chen et al. | |
| 2005/0277278 A1 | 12/2005 | Maleville et al. | |
| 2006/0046419 A1 | 3/2006 | Sandhu et al. | |
| 2006/0081919 A1 | 4/2006 | Inoue et al. | |
| 2006/0091456 A1 | 5/2006 | Montgomery | |
| 2006/0108635 A1 * | 5/2006 | Bhalla et al. | 257/329 |
| 2006/0128100 A1 * | 6/2006 | Aoki et al. | 438/259 |
| 2006/0138538 A1 | 6/2006 | Ohmi et al. | |
| 2006/0292825 A1 | 12/2006 | Lerner | |
| 2007/0034911 A1 | 2/2007 | Kao | |
| 2007/0048966 A1 | 3/2007 | Chau et al. | |
| 2008/0099344 A9 | 5/2008 | Basol et al. | |
| 2008/0157281 A1 | 7/2008 | Chau et al. | |
| 2009/0104751 A1 | 4/2009 | Chau et al. | |
| 2010/0032857 A1 | 2/2010 | Izadnegahdar et al. | |
| 2010/0072519 A1 | 3/2010 | Ohmi et al. | |

FOREIGN PATENT DOCUMENTS

| | | | |
|---|---|---|---|
| EP | 0628337 | 12/1994 | |
| EP | 628337 | 12/1994 | |
| EP | 1628337 | 2/2006 | |
| JP | S58100441 | 6/1983 | |
| JP | 58168258 | 10/1983 | |
| JP | S58-168258 | 10/1983 | |
| JP | 58197839 | 11/1983 | |
| JP | S6122630 | 1/1986 | |
| JP | 61256739 | 11/1986 | |
| JP | S61-256739 | 11/1986 | |
| JP | 62298130 | 12/1987 | |
| JP | 63228710 | 9/1988 | |
| JP | S63284832 | 11/1988 | |
| JP | S63291449 | 11/1988 | |
| JP | 401008672 | 1/1989 | |
| JP | EP0354449 | * 1/1989 | H01L 29/04 |
| JP | 64076755 | 3/1989 | |
| JP | S64-076755 | 3/1989 | |
| JP | 02035736 | 2/1990 | |
| JP | 02058248 | 2/1990 | |
| JP | 2002231945 | 8/2002 | |
| JP | 2004056003 | 2/2004 | |
| JP | 2004146626 | 5/2004 | |
| JP | 2004356114 | 12/2004 | |
| KR | 102004036958 | 5/2002 | |
| WO | 2004105116 | 2/2004 | |
| WO | 2004012234 | 5/2004 | |
| WO | 2004105116 | 12/2004 | |
| WO | 2006058210 | 1/2006 | |
| WO | 2006058210 | 6/2006 | |

OTHER PUBLICATIONS

"Effects on Selecting Channel Direction in Improving Performance of Sub-100 nm MOSFETs Fabricated on (110) Surface Si Substrate" Japanese Journal of Applied Physics, Part 1, vol. 43, No. 4B, Apr. 2004 pp. 1723-1728 (Nakamura et al.), XP00122768.

Nakamura et al., "Effects of Selecting Channel Direction in Improving Performance of Sub-100nm MOSFETs Fabricated on (110) Surface Si Substrate," Japanese Journal of Applied Physics, vol. 43, No. 4B, Japan, Apr. 27, 2004, pp. 1723-1728.

Peter Van Zant, Microchip Fabrication, 2000, McGraw-Hill Publication, Fourth Edition, p. 32.

* cited by examiner (001) WAFER WITH (001) FLAT

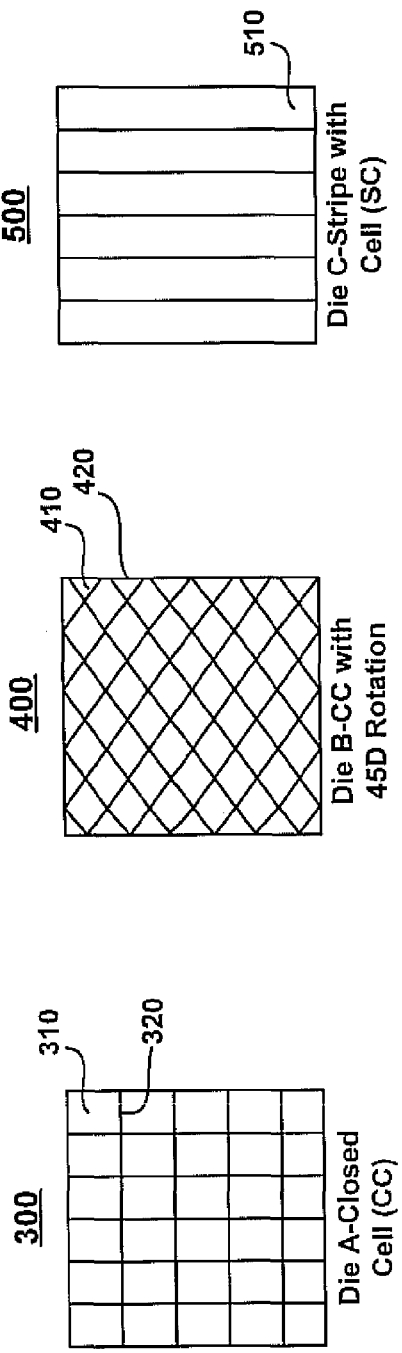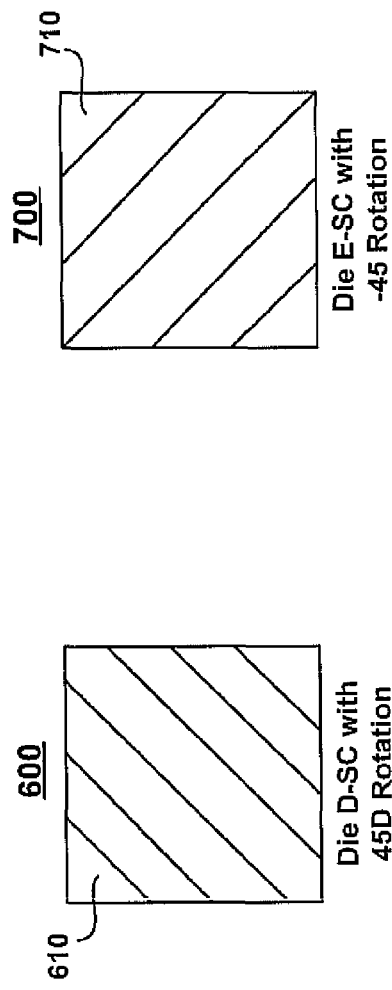
FIGURE 5 — Die C-Stripe with Cell (SC)
FIGURE 4 — Die B-CC with 45D Rotation
FIGURE 3 — Die A-Closed Cell (CC)
FIGURE 7 — Die E-SC with -45 Rotation
FIGURE 6 — Die D-SC with 45D Rotation

HIGH MOBILITY POWER METAL-OXIDE SEMICONDUCTOR FIELD-EFFECT TRANSISTORS

RELATED APPLICATION

This application claims priority to U.S. Provisional Application Ser. No. 60/753,550, entitled "High Mobility P-Channel Trench Power Metal-Oxide Semiconductor Field Effect Transistors," filed Dec. 22, 2005, to Pattanayak et al., which is hereby incorporated by reference herein in its entirety.

FIELD OF INVENTION

Embodiments of the present invention relate to the design and fabrication of semiconductors. More specifically, embodiments of the present invention relate to systems and methods for high mobility power metal-oxide semiconductor field effect transistors.

BACKGROUND

The on-state (or "on") resistance of a MOSFET (metal-oxide semiconductor field-effect transistor) device is an important figure of merit, especially for power devices. For example, when such a device is on, or conducting, a portion of the system power is lost due to resistance heating in the device. This leads to deleteriously decreased efficiency. Such resistance heating may also lead to heat dissipation problems, which in turn may lead to system overheating and/or decreased reliability. Consequently, devices with low on resistances are much desired.

The on resistance of a MOSFET (metal-oxide semiconductor field-effect transistor) device comprises mostly resistance of the channel, the drift layer and the substrate components. For low voltage MOSFETs, the channel resistance component provides a dominant contribution. The channel resistance is inversely proportional to the mobility of the carriers in the channel. In Silicon, the mobility of the carriers in the channel depends upon the crystal plane and the direction of current flow and this dependence is different for different types of carriers, e.g., electrons versus holes.

MOSFETs may be fabricated in crystalline Silicon. Geometry related to a crystal lattice is generally described in terms of the Miller index, which references the crystallographic axes of a crystal, e.g., a, b and c. As a crystal is periodic, there exist families of equivalent directions and planes. Herein, a plane, e.g., a surface of a wafer sliced from a crystal ingot, is described enclosed within parenthesis, e.g., (abc). This notation describes the (abc) plane and equivalent planes. Directions relative to the crystal lattice are described enclosed within brackets, e.g., [abc]. This notation describes the [abc] direction and equivalent directions.

The mobility of electrons in Silicon is known to be the maximum in the (100) crystalline plane and is weakly dependent on the direction of the current flow. In contrast, the mobility of holes is a strong function of both the orientation of the crystalline plane and the direction of the current flow. The mobility of the holes is maximum in the (110) crystalline plane and in the [110] direction.

It has been known for quite some time that the mobility of holes in the (110) crystalline plane depends on the direction of current flow being maximum in the [110] direction (D. Colman et al., Journal of Applied Physics, pp. 1923-1931, 1968). Their experimental results are shown in the graph of FIG. 1 (conventional art). From the graph of FIG. 1, it is evident that compared to the conventional (100) orientation, the hole mobilities in the (110) crystalline plane are increased by more than a factor of two, depending upon the gate bias.

Plummer et al. have also reported (1980 IEDM, pp. 104-106) that a trench power MOSFET fabricated on (100) wafers with trench side walls parallel to the (110) crystalline planes do exhibit higher hole mobility at higher gate voltages than corresponding trench MOSFETs with trench walls parallel to the (110) plane but with the direction of current flow being also in the [100] direction.

More recently, various authors have reiterated that the hole mobility is highest in the (110) plane and in the [110] direction (H. Irie et al., IEDM, pp. 225-228, 2004 and references therein). A patent for a trench lateral device has also been granted to Wendell P. Noble et al. (U.S. Pat. No. 6,580,154, issued Jun. 17, 2003).

However, conventional P-channel trench MOSFET devices are fabricated such that the holes flow in an inversion channel which is along the (100) crystalline plane and the direction of the current flow is in the [100] direction.

SUMMARY OF THE INVENTION

Therefore there exists a need for a power MOSFET device with reduced on resistance. What is additionally needed is a system and method for a P-Channel Trench Power MOSFET in which the holes are confined to the (110) plane and flow in the [110] direction. A further need exists for systems and methods for power MOSFETs that are compatible and complementary with existing systems and methods of semiconductor design and manufacturing. Embodiments of the present invention provide these advantages.

High mobility P-channel power metal oxide semiconductor field effect transistors are disclosed. In accordance with an embodiment of the present invention, a power MOSFET is fabricated such that the holes flow in an inversion/accumulation channel, which is along the (110) crystalline plane, and the current flow is in the [110] direction when a negative potential is applied to the gate with respect to the source. The enhanced channel mobility of holes leads to a reduction of the channel portion of the on-state resistance, thereby advantageously reducing total "on" resistance of the device.

In accordance with still another embodiment of the present invention, a power MOSFET structure includes a gate and a source. The power MOSFET further includes an inversion/accumulation channel, wherein holes flow in said inversion/accumulation channel. The channel is aligned along a (110) crystalline plane and the current flow is in a [110] direction when a negative potential is applied to said gate with respect to said source.

Alternative embodiments are directed to a vertical trench MOSFET wherein hole current is restricted to flow in a (110) plane and in a direction selected from the group comprising [110], [111], [112], [001] and their equivalents. The vertical trench MOSFET may be fabricated in a (110) wafer. The vertical trench MOSFET may operate wherein said hole current is responsive to applying a negative voltage potential to a gate of said MOSFET device with respect to a source of said MOSFET.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

FIGS. 3, 4, 5, 6 and 7 illustrate formation of trenches in a variety of different trench rotations.

DETAILED DESCRIPTION

Reference will now be made in detail to various embodiments of the present invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Figure 1:
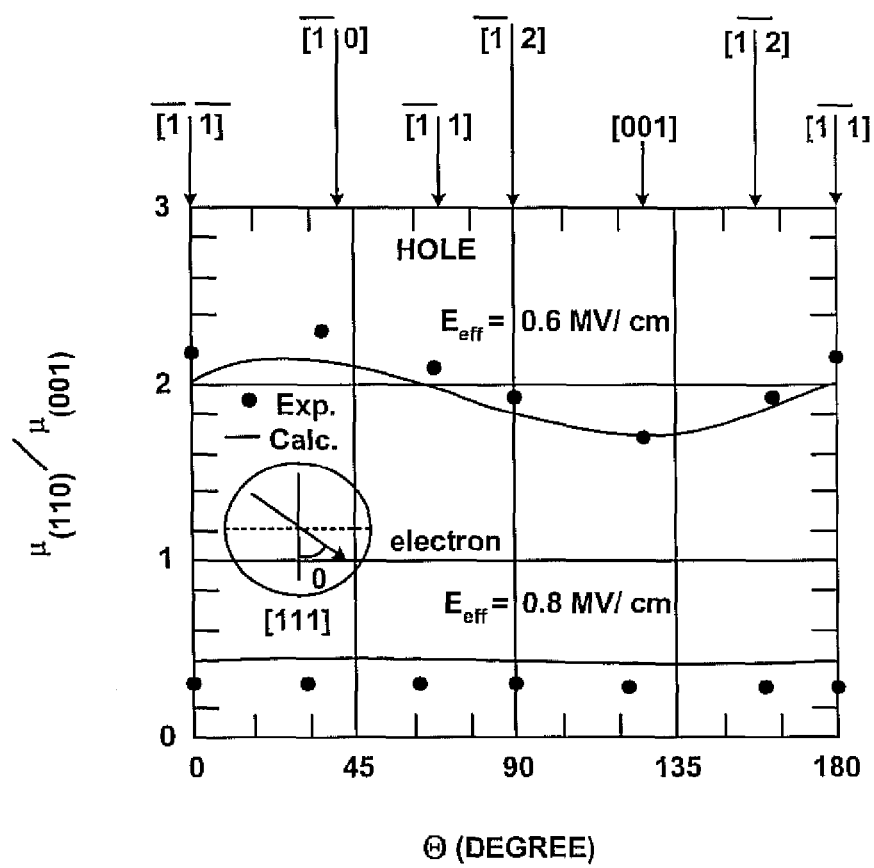
FIG. 1 illustrates experimental measurements of hole mobility based on crystalline plane orientation.
Figure 2:
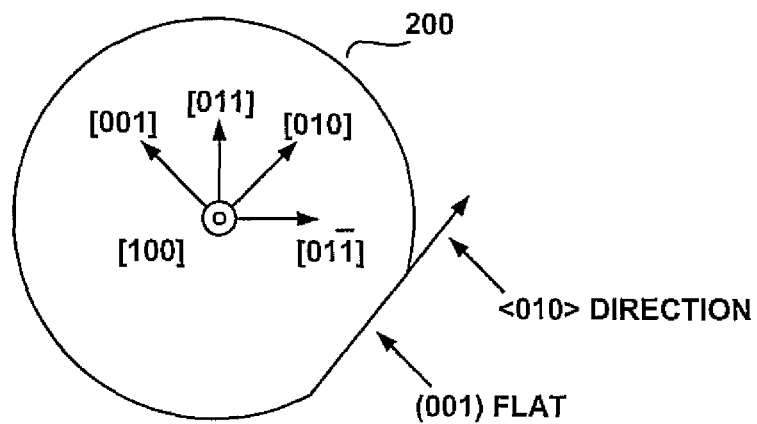
FIG. 2 illustrates a conventional wafer that is used to fabricate conventional P channel trench Power MOSFETs.

High Mobility P-Channel Trench Power Metal-Oxide Semiconductor Field-Effect Transistors FIG. 2 illustrates a conventional wafer 200 that may be used to fabricate conventional P channel trench Power MOSFETs. Wafer 200 is described as a (001) wafer with a (001) flat. Wafer 200 may also be described as having a flat in the <010> direction. The top surface of wafer 200 is a (100) plane. It is to be appreciated that the current flow direction in trench MOSFETs, where the current flow is from the top surface to the bottom surface of a wafer, e.g., wafer 200, will always be in the [100] direction, e.g., into the plane of the drawing, as illustrated in FIG. 2.

FIGS. 3, 4, 5, 6 and 7 illustrate formation of trenches in a variety of different trench rotations. FIG. 3 illustrates a closed cell trench structure 300. The vertical 310 and horizontal 320 trenches are bounded by equivalent (100) planes.

FIG. 4 illustrates a closed cell trench structure 400 formed with a 45 degree rotation. The rotated trenches 410 and 420 are bounded by equivalent (110) planes.

FIG. 5 illustrates a stripe cell trench structure 500. The vertical trenches 510 are bounded by equivalent (100) planes.

FIG. 6 illustrates a stripe cell trench structure 600 formed with a 45 degree rotation. The rotated trenches 610 are bounded by equivalent (110) planes.

FIG. 7 illustrates a stripe cell trench structure 700 formed with a −45 degree rotation. The rotated trenches 710 are bounded by equivalent (110) planes.

Experimental examples of die comprising stripe cell trench structure 500 of FIG. 5 and die comprising trench structure 600 formed with a 45 degree rotation of FIG. 5 have been fabricated. Preliminary analysis shows that the overall resistance of the rotated trench structure 600 formed with a 45 degree rotation, e.g., when the current flow is in the (110) plane, is lower than the conventional art devices with trenches in the (100) planes.

However, it is to be appreciated that, although current flow may be aligned with a (110) plane of wafer 200, trench current flow is in the [100] direction, as described previously.

Figure 8A:
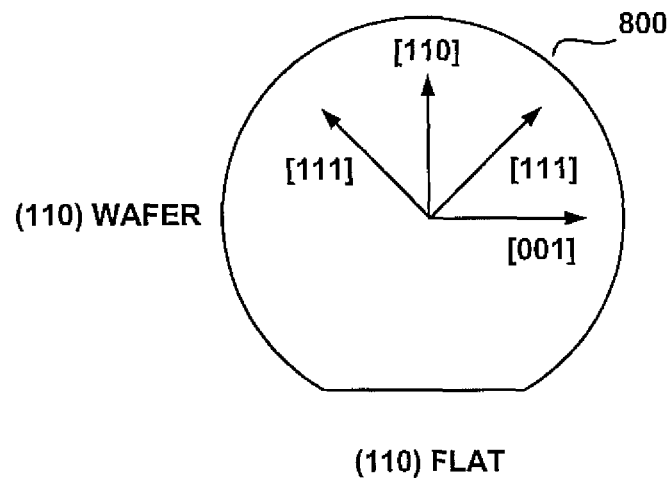
FIGS. 8A, 8B, 8C and 8D illustrate (110) wafers with a variety of flats, in accordance with embodiments of the present invention.

FIGS. 8A, 8B, 8C and 8D illustrate (110) wafers with a variety of flats, in accordance with embodiments of the present invention. It is to be appreciated that other flats are well suited to embodiments in accordance with the present invention. Wafer 800 of FIG. 8A is described as a (110) wafer with a (110) flat. A variety of crystalline orientations are illustrated, including [001], [111], and [110] to enable etching trenches with planes parallel to (001), (111) and (110) Equivalent Surfaces of the Silicon crystal respectively.

Figure 8B:
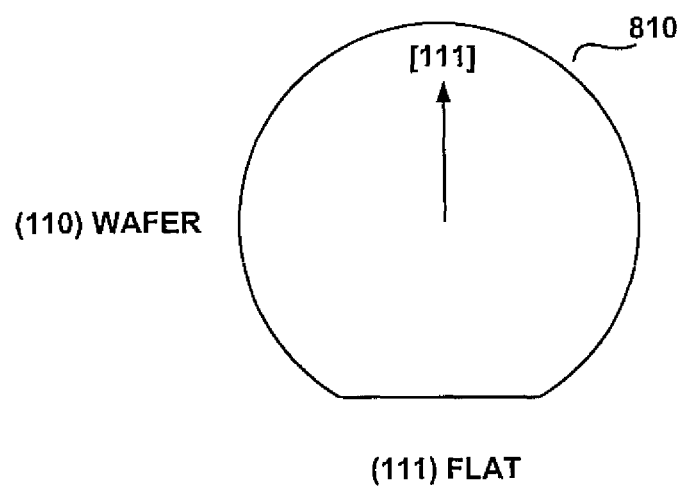
Figure 8C:
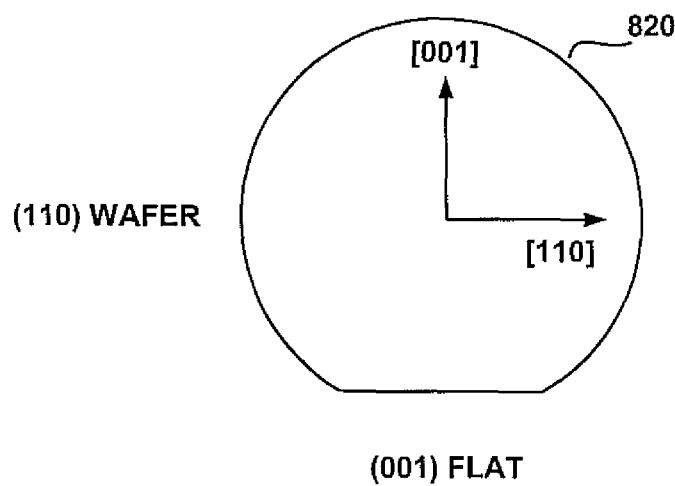

Wafer 810 of FIG. 8B is described as a (110) wafer with a [111] directed flat to enable etching trenches perpendicular to the flat so that the trench will have its surfaces bounded by {111} equivalent planes. The [111] crystalline direction is illustrated. Wafer 820 of FIG. 8C is described as a (110) wafer with a [001] directed flat.

Figure 8D:
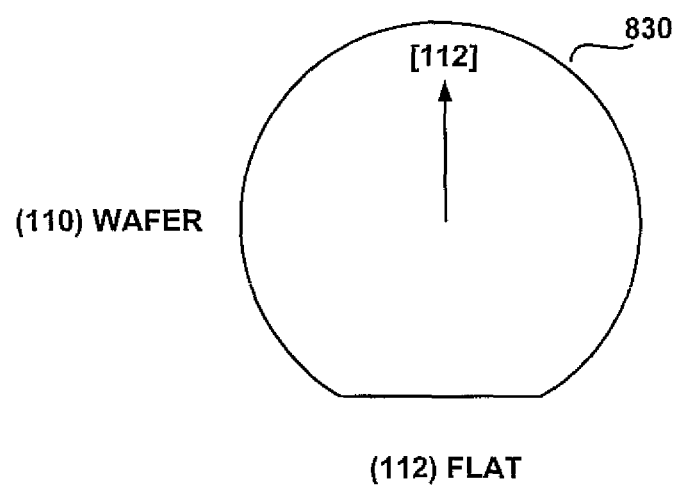

Wafer 830 of FIG. 8D is described as a (110) wafer with a [112] directed flat.

In accordance with embodiments of the present invention, a trench MOSFET formed in wafer 800 (FIG. 8A) will have hole current flow in the (110) plane and in the [110] direction. For example, the current flow from the top surface to the bottom surface will be in the [110] direction, e.g., into the plane of the drawing, as illustrated in FIG. 8A.

In accordance with other embodiments of the present invention, a trench MOSFET formed in wafer 810 (FIG. 8B) will have hole current flow in the (110) plane and in the [111] direction.

In accordance with alternative embodiments of the present invention, a trench MOSFET formed in wafer 820 (FIG. 8C) will have hole current flow in the (110) plane and in the [001] direction.

In accordance with still other embodiments of the present invention, a trench MOSFET formed in wafer 830 (FIG. 8D) will have hole current flow in the (110) plane and in the [112] direction.

Figure 9:
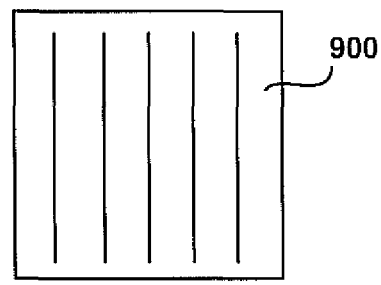
FIG. 9 illustrates etched trenches perpendicular to the flat of wafer, in accordance with embodiments of the present invention.

FIG. 9 illustrates etched trenches 900 perpendicular to the flat of wafer 800 (FIG. 8A), in accordance with embodiments of the present invention. It is appreciated that trenches 900 are in (110) or equivalent planes. As the wafer surface is (110) plane, the direction of hole current flow is thus also in the [110] direction. It is appreciated that embodiments of the present invention are well suited to trenches formed perpendicular to other flat orientations, e.g., as illustrated in FIGS. 8B, 8C and/or 8D.

Figure 10:
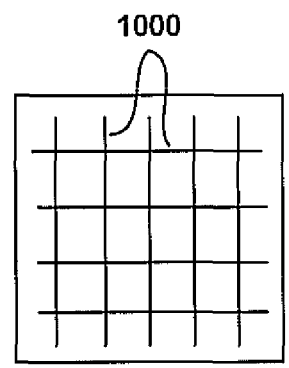
FIG. 10 illustrates etched trenches that are both parallel and perpendicular to the flat of wafer, in accordance with embodiments of the present invention.

FIG. 10 illustrates etched trenches 1000 that are both parallel and perpendicular to the flat of wafer 800 (FIG. 8A), in accordance with embodiments of the present invention. It is appreciated that trenches 1000 are in (110) or equivalent planes. As the wafer surface is (110) plane, the direction of hole current flow is thus also in the [110] direction. It is appreciated that embodiments of the present invention are well suited to trenches formed relative to other flat orientations, e.g., as illustrated in FIGS. 8B, 8C and/or 8D.

Figure 11:
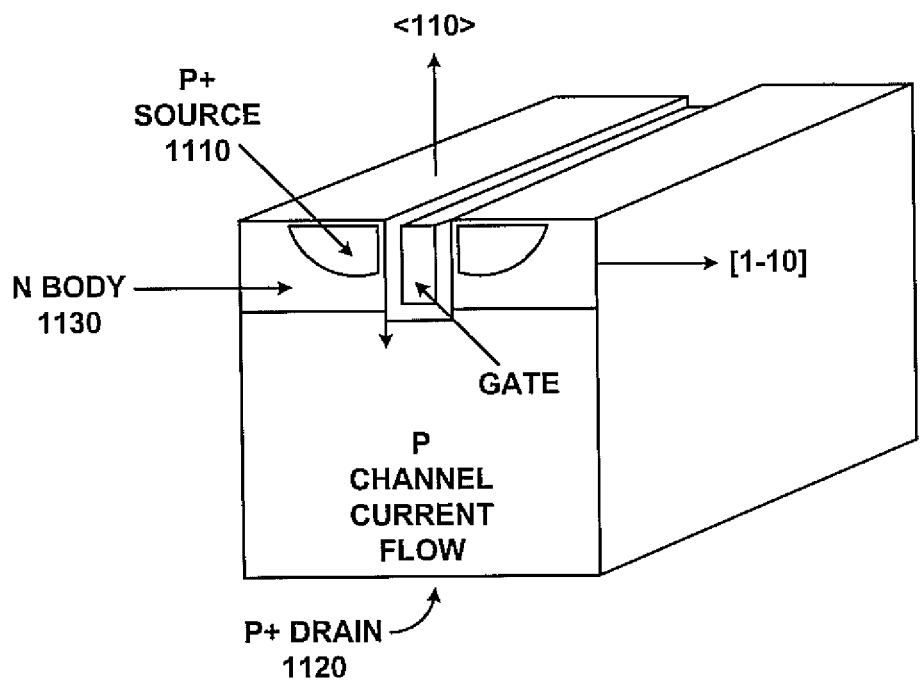
FIG. 11 illustrates a schematic diagram of a trench MOSFET structure, in accordance with embodiments of the present invention.

FIG. 11 illustrates a schematic diagram of a trench MOSFET structure 1100, in accordance with embodiments of the present invention. Trench MOSFET structure 1100 comprises a P+ source 1110, an N body 1130 and a P+ drain 1120. Trench MOSFET structure 1100 may be formed in and on wafer 800 (FIG. 8A), to provide a desirable orientation for hole current flow. The crystalline plane directions of trench MOSFET structure 1100 are illustrated in FIG. 11. It is to be appreciated that current flow between the source 1110 and drain 1120 of trench MOSFET structure 1100 is in the [110] (or equivalent) direction. It is to be appreciated that embodiments of the present invention are well suited to trenches formed perpendicular to other flat orientations, e.g., as illustrated in FIGS. 8B, 8C and/or 8D.

Figure 12:
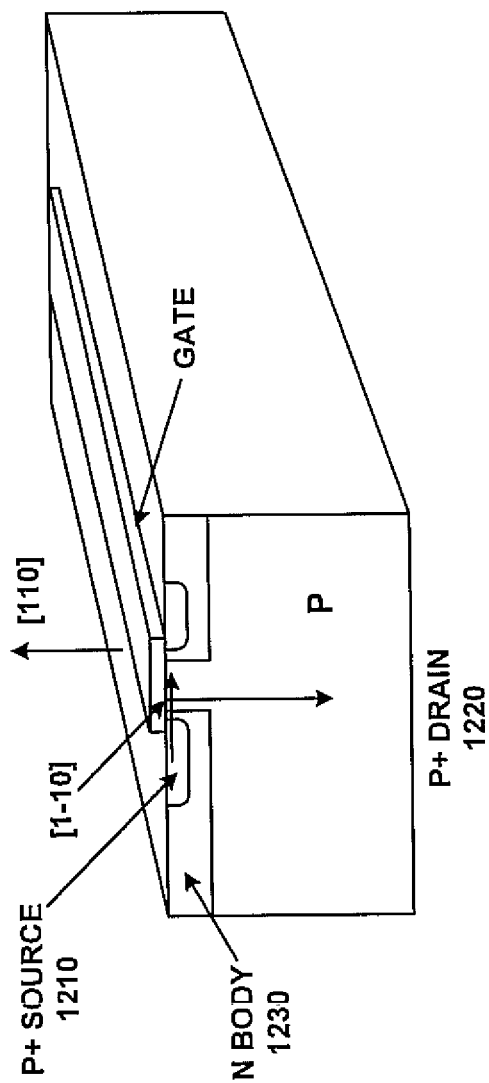
FIG. 12 illustrates a schematic diagram of a vertical double diffused planar gate p channel MOSFET structure (DMOSFET), in accordance with embodiments of the present invention.

FIG. 12 illustrates a schematic diagram of vertical double diffused MOSFET with a planar gate (DMOSFET) P channel structure 1200, in accordance with embodiments of the present invention. DMOSFET P channel structure 1200 comprises a P+ source 1210, an N body 1230 and a P+ drain 1220. DMOSFET P channel structure 1200 may be formed in and on wafer 800 (FIG. 8A), to provide a desirable orientation for hole current flow. The crystalline plane directions of DMOSFET P channel structure 1200 are illustrated in FIG. 12. It is to be appreciated that current flow between the source 1210 and drain 1220 of DMOSFET P channel structure 1200 is in the [110] direction. It is appreciated that embodiments of the present invention are well suited to channel alignment perpendicular to other flat orientations, e.g., as illustrated in FIGS. 8B, 8C and/or 8D.

It is appreciated that oxide growth rates are different in different crystalline planes. For example, oxide generally grows faster in the [110] direction compared to in the [100] direction. The surface charge in the (110) plane is about twice that in the (100) plane. It is desirable to take these characteristics into account while designing for required threshold voltage of the high mobility MOSFETs.

Figure 13:
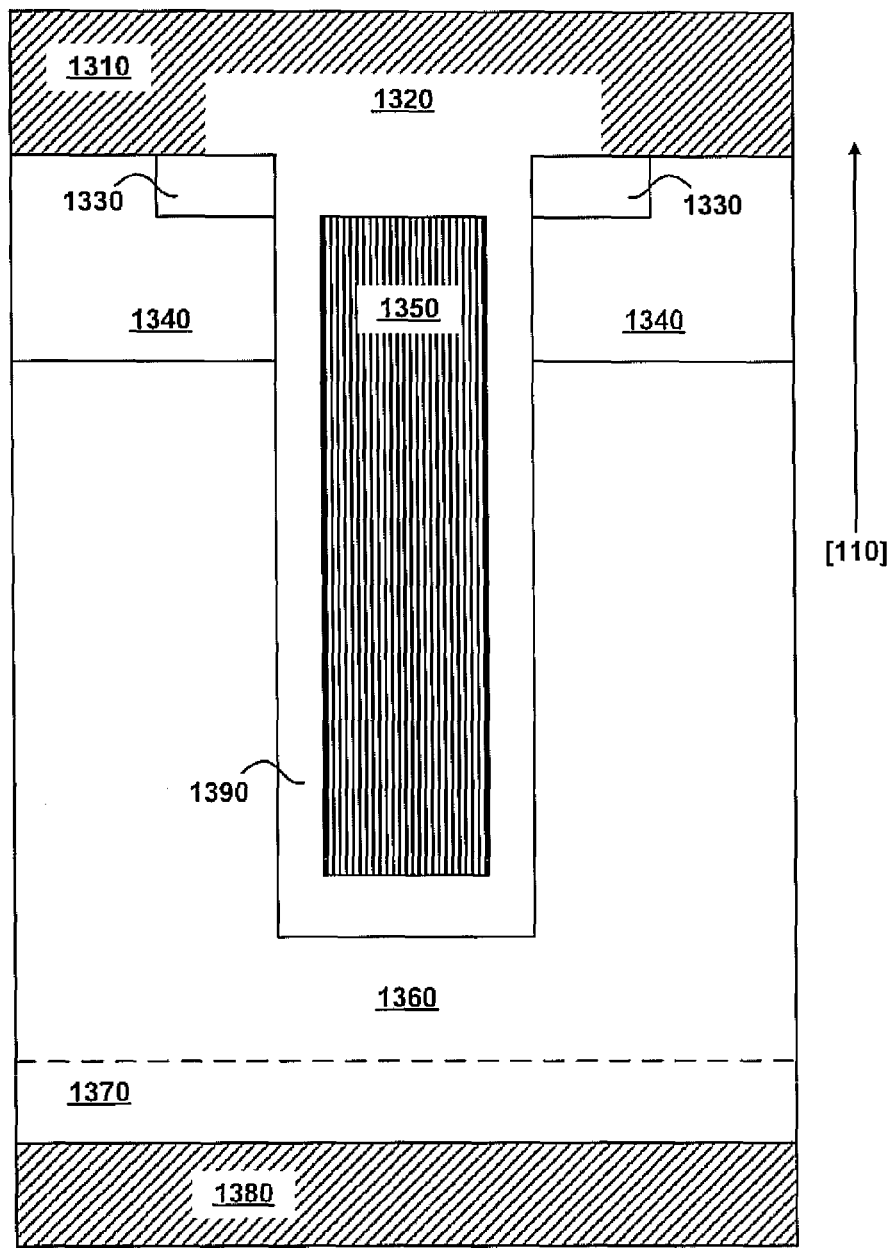
FIG. 13 illustrates a schematic drawing of a high mobility P channel trench MOSFET device, in accordance with embodiments of the present invention.

FIG. 13 illustrates a schematic drawing of a high mobility P channel accumulation trench MOSFET 1300, in accordance with embodiments of the present invention. Trench MOSFET 1300 comprises source metal 1310, an insulator 1320, P+ source regions 1330 and an N body 1340. Trench MOSFET 1300 also comprises a polysilicon gate 1350, gate oxide 1390 and a P– drift region 1360. Trench MOSFET 1300 further comprises a substrate 1370 and drain metallization 1380.

It is to be appreciated that trench MOSFET 1300 is fabricated in a [110] direction, as indicated in FIG. 13. In accordance with embodiments of the present invention, trench MOSFET 1300 may be formed perpendicular to a (110) flat. It is appreciated that embodiments of the present invention are well suited to trenches formed perpendicular to other flat orientations, e.g., as illustrated in FIGS. 8B, 8C and/or 8D.

During current conduction, trench MOSFET 1300 inverts the channel (N body 1340) and accumulates charge in the lightly doped accumulation region (P– drift region 1360) forming a P+ accumulation layer near gate 1350. Hence, current flows in an inversion layer within N body 1340 as well as within the accumulation layer formed next to gate 1350.

The breakdown voltage is supported at the P N junction extending into the drift region. However, unlike the conventional trench MOSFET, the drift resistance consists of two parallel components: one is the accumulation region resistance and the other is the resistance of the drift region. The accumulation resistance component is less than that of the drift region resistance. In accordance with embodiments of the present invention, the overall resistance of the drift region will be substantially reduced from the corresponding values for conventional accumulation power MOSFET devices due to the current flow being in a (110) plane and a [110] direction.

In this novel MOSFET design, by fabricating a MOSFET with the plane of the accumulation layer as (110), and direction of accumulation layer as [110], the accumulation layer resistance will be greatly reduced, e.g., by a factor of about two.

Embodiments in accordance with the present invention provide a system and method for a power MOSFET device with reduced on resistance. Embodiments in accordance with the present invention also provide for systems and methods for a P-Channel Trench Power MOSFET in which the holes are confined to the (110) plane and flow in the [110] direction. Further, embodiments in accordance with the present invention provide for systems and methods for power MOSFETs that are compatible and complementary with existing systems and methods of semiconductor design and manufacturing.

Various embodiments of the invention, high mobility P-channel power metal oxide semiconductor field effect transistors, are thus described. While the present invention has been described in particular embodiments, it should be appreciated that the invention should not be construed as limited by such embodiments, but rather construed according to the below claims.

What is claimed is:

1. A vertical trench silicon MOSFET comprising:
   a (110) wafer including:
      an orientation flat;
      a trench perpendicular to the orientation flat of the (110) wafer, wherein the trench includes a plurality of trench surfaces; and
      a channel, wherein the orientation flat is a [111] directed flat, and wherein the trench surfaces are bounded by {111} equivalent planes.

2. A channel structure for a vertical DMOSFET comprising:
   a (110) wafer including:
      an orientation flat;
      a trench perpendicular to the orientation flat of the (110) wafer, wherein the trench includes a plurality of trench surfaces; and
      a P channel, wherein the orientation flat is a [111] directed flat, and wherein the trench surfaces are bounded by {111} equivalent planes.

3. A p channel power MOSFET structure comprising:
   a (110) wafer including:
      an orientation flat;
      a gate;
      a source;
      a trench perpendicular to the orientation flat of the (110) wafer, wherein the trench includes a plurality of trench surfaces; and
      an inversion/accumulation channel, wherein the flat is a [111] directed flat, and wherein the trench surfaces are bounded by {111} equivalent planes.

4. A semiconductor comprising:
   a (110) wafer including:
      an orientation flat;
      vertical DMOSFET means comprising:

a trench perpendicular to the orientation flat of the (110) wafer, wherein the trench includes a plurality of trench surfaces; and P channel means, wherein the orientation flat is a [111] directed flat, and wherein the trench surfaces are bounded by {111} equivalent planes.

5. A p channel power MOSFET structure comprising:

a (110) wafer including:

an orientation flat;

gate means;

source means;

a trench perpendicular to the orientation flat of the (110) wafer, wherein the trench includes a plurality of trench surfaces; and inversion/accumulation channel means, wherein the orientation flat is a [111] directed flat, and wherein the trench surfaces are bounded by {111} equivalent planes.

\* \* \* \* \*